(12) United States Patent
Labonté et al.

(10) Patent No.: US 8,580,628 B2
(45) Date of Patent: Nov. 12, 2013

(54) INTEGRATED CIRCUIT CONTACT STRUCTURE AND METHOD

(75) Inventors: André P. Labonté, Scarborough, ME (US); Richard S. Wise, Ridgefield, CT (US); Ying Li, Ridgefield, CT (US); Brett H. Engel, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 25 days.

(21) Appl. No.: 13/365,030

(22) Filed: Feb. 2, 2012

(65) Prior Publication Data
US 2013/0200441 A1 Aug. 8, 2013

(51) Int. Cl.
*H01L 21/336* (2006.01)

(52) U.S. Cl.
USPC ............ 438/197; 438/216; 438/586; 257/288

(58) Field of Classification Search
USPC ........... 438/197, 216, 586; 257/288, E27.059
See application file for complete search history.

(56) References Cited

U.S. PATENT DOCUMENTS

| | | | | |
|---|---|---|---|---|
| 7,985,676 | B2 * | 7/2011 | Klee et al. | 438/637 |
| 2011/0156107 | A1 * | 6/2011 | Bohr et al. | 257/288 |
| 2011/0298061 | A1 * | 12/2011 | Siddiqui et al. | 257/410 |

* cited by examiner

*Primary Examiner* — Theresa T Doan
(74) *Attorney, Agent, or Firm* — Ingrassia Fisher & Lorenz, P.C.

(57) ABSTRACT

An integrated circuit having a mis-alignment tolerant electrical contact is formed by providing a semiconductor containing substrate over which is a first FET gate laterally bounded by a first dielectric region, replacing an upper portion of the first FET gate with a second dielectric region, applying a mask having an opening extending partly over an adjacent source or drain contact region of the substrate and over a part of the second dielectric region above the first FET gate, forming an opening through the first dielectric region extending to the contact region and the part of the second dielectric region, and filling the opening with a conductor making electrical connection with the contact region but electrically insulated from the first FET gate by the second dielectric region. A further FET gate may also be provided having an electrical contact thereto formed separately from the source-drain contact.

11 Claims, 9 Drawing Sheets

INTEGRATED CIRCUIT CONTACT STRUCTURE AND METHOD

FIELD OF THE INVENTION

This invention relates generally to methods and structures for forming semiconductor devices and integrated circuits (ICs) incorporating contacts, including contacts in close proximity to other device regions that are intended to be electrically insulated from such contacts.

BACKGROUND OF THE INVENTION

It is very common in the semiconductor (SC) device and integrated circuit (IC) arts to place contacts to a semiconductor (SC) body or layer in close proximity to other device regions that often must remain substantially insulated from such contacts. A well known example is source and/or drain (S-D) contacts of field effect transistors (FETs). The S-D contacts are electrical conductors that provide Ohmic electrical connections to underlying source and/or drain regions of the FET. Such source and/or drain (S-D) contacts are generally desired to be laterally very close to but insulated from a gate conductor that overlies and is insulated from the portion of the semiconductor body or layer between the source and drain regions. When the gate conductor is appropriately biased with respect to the S-D contacts and the S-D regions, it creates a conductive channel extending between the S-D regions. It is this controllable conductive channel that gives rise to the desirable properties of such FETs and of the ICs made up of multiple interconnected FETs.

There is an ongoing need to provide ever denser and more complex SC devices and ICs. This is accomplished in part by reducing the dimensions and spacing of the various device regions. The spacing and alignment of the various device regions are generally determined lithographically, that is by using doping, deposition and/or etching masks. However, as dimensions of the various mask openings and the spacing of such openings become smaller and smaller, alignment tolerance, dimensional tolerance and other errors inherent in the photo-lithographic process become more and more significant and can adversely affect manufacturing yield and cost. Thus, there is an ongoing need to be able to provide contacts closely spaced to but insulated from other device regions or elements where the structure and process used to form such contacts are more tolerant of inherent errors in contact alignment, placement and/or size. This is especially important in connection with field effect transistors (FETs) but also applies to many other semiconductor devices and ICs where contacts must be placed in close proximity to but insulated from other electrical conductors or device regions. Accordingly, the present invention is not limited to FETs but applies generally to any types of semiconductor devices and ICs where such closely spaced contacts are needed.

BRIEF SUMMARY OF THE INVENTION

An integrated circuit (40) having a mis-alignment tolerant electrical contact (44) is formed by providing a semiconductor containing substrate (21) over which is a first FET gate (26) laterally bounded by a first dielectric region (34), replacing an upper portion (264) of the first FET gate (26) with a second dielectric region (29), applying a mask (40) having an opening (401) extending partly over an adjacent source or drain (22) contact region (221) of the substrate (21) and over a part (292) of the second dielectric region (29) above the first FET gate (26), forming an opening (41) through the first dielectric region (34) extending to the contact region (221) and the part (292) of the second dielectric region (29), and filling the opening (41) with a conductor (44) making electrical connection with the contact region (221) but electrically insulated from the first FET gate (26) by the second dielectric region (29). A further FET gate (36) may also be provided having an electrical contact (47, 71-1) thereto formed separately from the source-drain contact (44, 71-2).

While for convenience of explanation, embodiments of the invention are described in terms of gates (26, 36) and contacts (221) to source or drain regions (22-1, 22-1') of field effect transistors (42-1, 42-2), they are not limited to such devices, contacts and/or conductors and apply to any semiconductor device or integrated circuit where it is desired to provide closely spaced but otherwise insulated mis-alignment tolerant contacts (e.g., contacts 221, 44, 71-2) and conductors (e.g., conductors 26) without interfering with the formation of connections (47, 71-1) to other conductors (36) elsewhere in the IC (40).

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof used herein, are intended to cover non-exclusive inclusions, such that a process, method, article, or apparatus that "comprises", "includes" or has a list of elements or steps is not necessarily limited to those elements or steps, but may include other elements or steps not expressly listed or inherent to such process, method, article, or apparatus. As used herein the terms "substantial" and "substantially" mean sufficient to accomplish the stated purpose in a practical manner and that minor imperfections, if any, are not significant for the stated purpose. Furthermore, the terms "first," "second," "third," and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or fabrication in sequences, orientations and arrangements other than those illustrated or otherwise described herein. In addition, as used herein, the term "mis-alignment" is intended to encompass any type of lithographic error, including but not limited to errors in placement or sizing or both of lithographically defined images, regions or elements.

Metal-oxide-semiconductor (MOS) devices are a well known form of field effect transistors (FETs). Complimentary metal-oxide-semiconductor (CMOS) devices, that is, with both P-channel (PMOS) and N-channel (NMOS) devices, are much used in integrated circuits (ICs). The term metal-oxide-semiconductor and the abbreviation "MOS" are widely used in the art to refer to insulated gate field effect transistors or devices (IGFETs) irrespective of whether they employ metals or some other form of conductor for the gates of such devices, and irrespective of whether they use oxides or some other form of dielectrics for the gate insulators. Semiconductors, doped semiconductors, metals, metal alloys, metal-semiconductor alloys, semi-metals and combinations thereof are non-limiting examples of suitable gate conductors. Oxides, nitrides, fluorides, combinations thereof and other inorganic and organic dielectrics are non-limiting examples of suitable gate insulators. Accordingly, the terms metal-oxide-semiconductor and the abbreviations MOS, MOSFET, PMOS, PFET, NMOS NFET and CMOS as used herein are intended to refer broadly to such insulated gate field effect transistors or devices and not be limited merely to those employing just metals and/or just oxides.

For convenience of explanation, embodiments of the invention are described herein for MOSFETs employing silicon (Si) semiconductor (SC), and with source and/or drain regions and gates. However, persons of skill in the art will understand that the invention is not limited merely to Si semiconductors and not merely to FETs, but also applies to other semiconductor materials and other types of SC devices, where electrical contacts closely spaced to but electrically insulated from other device regions are needed. Accordingly, the term FET should be interpreted broadly to include any type of SC device, the term "gate" should be interpreted broadly to include any kind of conductor or conductive region whether functioning as a MOSFET gate or not, and the terms "source" and/or "drain" (and the abbreviation "S-D") and "contacts" thereto should also be interpreted broadly to refer to any kind of SC region and any type of contact thereto, whether or not such region functions as a source or drain region of a FET or other type of device. Further, as used herein, the term "semiconductor" and the abbreviation "SC", singular or plural, are intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, semiconductor layers, insulating substrates, and combinations thereof, such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not.

Figure 1:
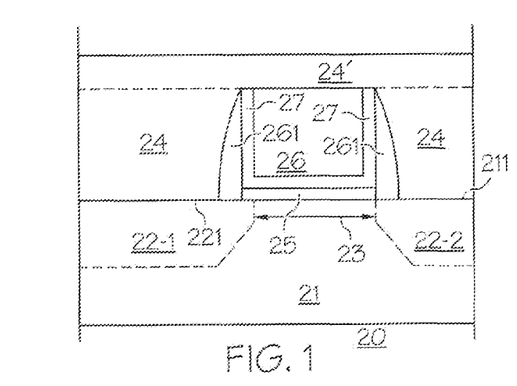
FIGS. 1-4 show simplified cross-sectional views of semiconductor device or portions of an integrated circuit (IC) embodying a FET whose source or drain (S-D) contact is intended to be located in close proximity to but insulated from an adjacent conductive gate, illustrating how contact mis-alignment or mis-placement can result in an unintended short between the S-D contact and the gate of the FET.

FIGS. 1-4 show simplified cross-sectional views of a semiconductor device or portion of an integrated circuit (IC) embodying FET 20 whose source or drain contact 32 (see FIG. 4) is intended to be located in close proximity to but insulated from adjacent conductive gate 26, illustrating how contact mis-alignment or other lithographic error can result in unintended short 33 between source or drain contact 32 and gate 26 of FET 20. Referring to FIG. 1, FET 20 is formed on and/or in semiconductor substrate 21 having upper surface 211. Spaced apart source-drain regions 22-1, 22-2 (collectively 22) are provided in substrate 21 proximate surface 211. Either of doped regions 22-1, 22-2 may serve as source or drain, or any other type of underlying semiconductor region to which electrical contact is desired. Overlying surface 211 between spaced-apart source-drain regions 22-1, 22-2 are gate insulator 25 and gate conductor 26. When gate conductor 26 is appropriately biased, electrical current can flow through channel region 23 between spaced apart S-D regions 22-1, 22-2.

Figure 2:
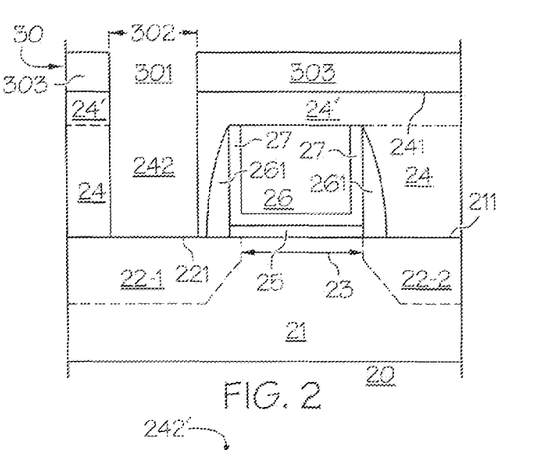
Figure 3:
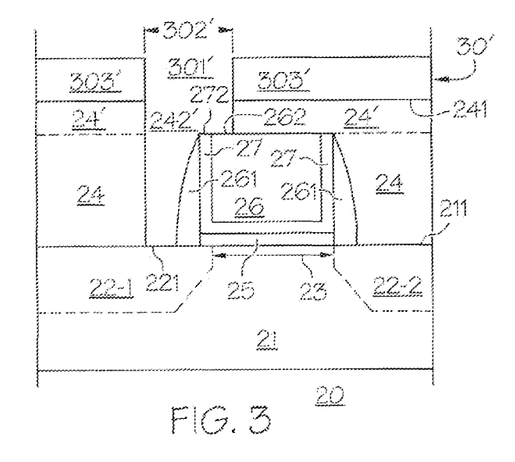

Dielectric sidewalls 261 are conveniently provided on lateral sides of gate 26. In this example, gate conductor 26 also has barrier layer 27 separating gate conductor 26 from dielectric sidewalls 261 and desirably also from gate insulator 25. In further embodiments, gate insulator 25 may encapsulate barrier layer 27 laterally as well as underlying barrier layer 27 so that dielectric material 25 is also present between dielectric sidewalls 261 and barrier layer 27. For economy of presentation, such embodiment is not shown in the accompanying drawings. Either arrangement is useful. Barrier layer 27 is optional. Dielectric region or layer 24 laterally surrounds gate 26 with sidewalls 261 and optional barrier layer 27. Dielectric region 24 may include portion 24' that overlies gate 26, sidewalls 261 and barrier layer 27. Referring now to FIGS. 2 and 3, in order to make electrical contact to source or drain region 22-1 (or whatever SC region underlies dielectric 24), opening or passage 242, 242' must be provided through dielectric 24 to surface (e.g., "contact") portion 221 of SC region 22-1 of substrate 21.

FIG. 2 illustrates the situation where correctly sized and aligned contact opening or passage 242 is created. Mask 30 overlying surface 241 of dielectric 24 in FIG. 2, has open portion 301 of lateral width 302 and closed portions 303. Open portion 301 is correctly positioned (i.e., properly "aligned") and of an appropriate size so that passage 242 may be formed through dielectric 24 to expose portion 221 of underlying SC region 22-1 without extending laterally to gate 26 and barrier layer 27. When mask 30 is removed and passage 242 filled with conductor (not shown), electrical contact is provided to surface 221 of underlying SC region 22-1 without also contacting gate 26, as is desired. Persons of skill in the art will understand that another contact (not shown in FIGS. 1-4) leads to SC region 22-2 so that when gate conductor 26 is appropriately biased current may flow through channel region 23 between SC regions 22-1 and 22-2.

Figure 4:
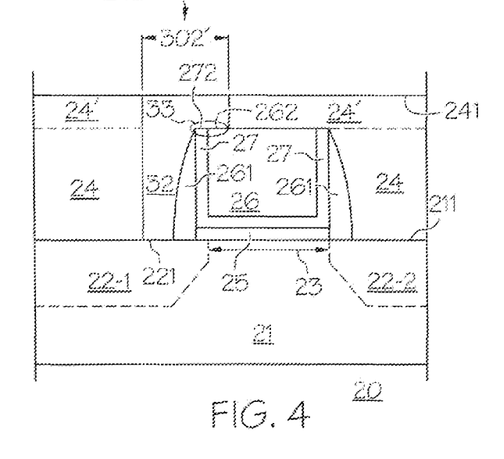

FIG. 3 illustrates the situation where a mis-aligned or mis-sized contact opening or passage 242' is formed. Mask 30' overlying surface 241 of dielectric 24 in FIG. 3 has open portion 301' of lateral width 302' (in this example the same as width 302 of FIG. 2) and closed portions 303'. Open portion 301' is incorrectly positioned (i.e., "mis-aligned") with respect to gate 26 and barrier layer 27. When passage 242' is etched through dielectric 24 to expose portion 221 of underlying SC region 22-1, passage 242' also extends laterally over part of gate 26 and barrier layer 27. When mask 30' is removed and passage 242' filled with conductive material as shown in FIG. 4, electrical contact 32 is provided to underlying SC region 22, as is desired, but also to surface portion 262 of gate 26 and surface portion 272 of barrier layer 27 via overlap region 33. Overlap region 33 creates an electrical "short", i.e., a relatively low resistance path, between contact 32 and gate 26. This is not desirable. Electrical short overlap region 33 can come about from mis-alignment of mask opening 301' or from mis-sizing of mask opening 301', leading to mis-alignment (i.e., mis-placement) of contact opening 242' or mis-sizing if contact opening is larger than desired. Either way, mask opening 301' laps over partly onto gate 26 and/or barrier layer 27. Thus, either type of defect can lead to the undesirable outcome of an electrical short between contract 32 and gate 26. Persons of skill in the art will understand that such short (i.e. relatively low resistance path) can occur between any type of electrically conductive contact and a nearby electrically conductive device region and is not limited merely to source or drain regions and gates of FETs.

FIGS. 5-15 show simplified cross-sectional views of IC 40 at various manufacturing stages 505-515, embodying FETs or FET regions FETs 42-1 and 42-2 (collectively 42), according to an embodiment of the invention. Each FET 42 has source, drain and gate regions generally analogous to those of FET 20 of FIGS. 1-4 but differing in detail. FET 42-1 embodies a source-drain (S-D) contact (i.e., S-D contact 44 of FIGS. 12-15) analogous to S-D contact 32 of FIG. 4 and with the same mis-alignment with respect to gate 26 as was shown in FIGS. 3-4, but where the S-D contact-to-gate short arising from overlap region 33 of FIG. 4 is avoided. FET 42-2 embodies just a gate contact (e.g., contact 47 of FIG. 15 or contact 71-1 of FIG. 19) illustrating that the mis-alignment tolerant structure and method shown in connection with FET 42-1 does not interfere with making contact to gate 36 of FET 42-2 elsewhere in IC 40.

For convenience of description, the same reference numbers are used in FIGS. 5-15 to refer to device regions of FET 42-1 analogous to those shown for FET 20 in FIGS. 1-4. In FET 42-2, S-D regions 22-1', 22-2', channel region 23', gate insulator 35, gate 36, dielectric sidewalls 361 and barrier layer 37 are analogous to S-D regions 22-1, 22-2, channel region 23, gate insulator 25, gate 26, dielectric sidewalls 261 and barrier layer 27 of FET 42-1, respectively. FETs 42-1, 42-2 (collectively 42) in connection with FIGS. 5-19 are intended to include: (1) the situation where FETs 42-1, 42-2, 42 illustrate cross-sections of separate FETs, for example, located in different parts of IC 40, and/or (2) the situation where FETs 42-1, 42-2, 42 illustrate cross-sections from different parts of the same FET, as for example, where FET 42-2 is a cross-section through the same FET as FET 42-1 but along a plane lying in front of or behind the plane of FET 42-1 in FIGS. 5-19. Accordingly, the terms FET 42-1, FET 42-2 (collectively FET or FETs 42), as used herein, are intended to refer to either or both situations.

Figure 5:
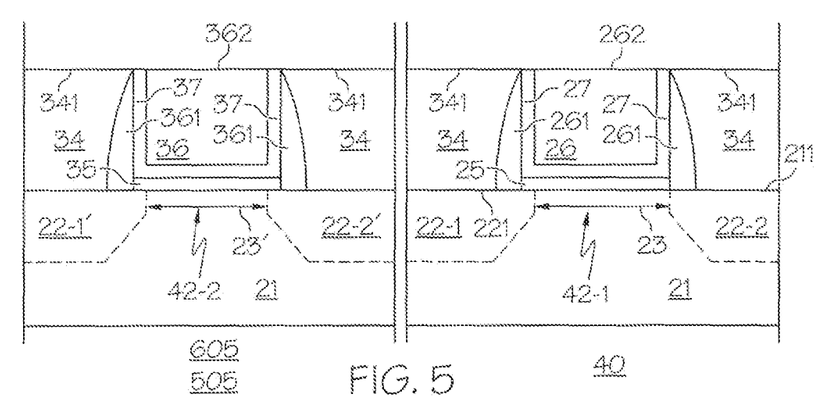
FIGS. 5-15 show simplified cross-sectional views at various manufacturing stages, according to an embodiment of the invention, of a portion of an IC embodying several FETs analogous to those of FIGS. 1-4 and with the same contact mis-alignment or mis-placement shown in FIG. 3, but where the S-D contact-to-gate short illustrated in FIG. 4 is avoided.

Referring now to manufacturing stage 505 of FIG. 5, IC 40 includes substrate 21 (e.g., having silicon as the SC in its active regions) and with upper surface 211 in and on which FETs 42-1, 42-2 are formed. FET 42-1 includes S-D regions 22-1, 22-2 (generally 22), channel region 23, gate insulator 25, conductive gate or other electrode 26 having upper surface 262, barrier layer 27, and dielectric sidewalls 261. As noted earlier, in other embodiments, dielectric 25 may also extend vertically between barrier layer 27 and sidewalls 261 to laterally separate them. Either arrangement is useful. FET 42-2 includes S-D regions 22-1', 22-2', channel region 23', gate insulator 35, conductive gate or other electrode 36 having upper surface 362, barrier layer 37, and dielectric sidewalls 361. Analogous to the discussion of FET 42-1 above, in still other embodiments, dielectric 35 may also extend vertically between barrier layer 37 and sidewalls 361 to laterally separate them. Either arrangement is useful. Gates 26, 36, barrier layers 27, 37, and gate sidewalls 261, 361 are laterally surrounded by dielectric region or layer 34 analogous to layer or region 24 of FIGS. 1-4 but without upper portion 24'. Either of SC regions 22-1, 22-2 of FET 42-1 may serve as a source region or drain region or any other device region in substrate 21 to which a contact is desired. Either of SC regions 22-1', 22-2' of FET 42-2 may serve as a source region or drain region or any other device region in substrate 21, but in this example, no contact is being made to regions 22-1', 22-2' at this location.

Silicon oxide, silicon oxynitride, and hafnium oxide are non-limiting examples of materials suitable for use in gate insulators 25, 35 but other dielectric materials may also be used. Hafnium oxide is preferred. Aluminum, tungsten, and titanium nitride are non-limiting examples of material suitable for use in gate conductor 26 with upper surface 262 and gate conductor 36 with upper surface 362, but other materials may also be used for one or both of gates conductors 26, 36. Aluminum is preferred. While the term "gate" is used herein to refer to conductors 26, 36, it is not necessary that such conductors act as FET gates and they may serve any electrically conductive purpose. Titanium nitride, titanium-aluminum nitride, and tantalum nitride are non-limiting examples of material suitable for use in barrier layers 27, 37 but other materials may also be used for one or both of barrier layers 27, 37 and one or both barrier layers 27, 37 may be omitted in other embodiments. Silicon nitride, silicon oxide, and silicon carbide are non-limiting examples of material suitable for use in dielectric sidewalls 261, 361 but other materials may also be used for one or both of dielectric sidewalls 261, 361 or they may be omitted in still other embodiments. [Silicon oxide and silicon nitride are non-limiting examples of suitable materials for dielectric region or layer 34, but other materials may also be used. Silicon oxide is preferred. Dielectric region or layer 34 has upper surface 341. Structure 605 results. It is desirable but not essential that dielectric region 34 and dielectric sidewalls 261, 361 be chosen from materials that may be differentially etched, that is, one etched without substantially affecting the other. This facilitates manufacturing stage 511 described later where it is desired to open passage 41 (see FIG. 11) in dielectric region or layer 34 without substantially affecting dielectric sidewalls 261 (see FIG. 11) that may be exposed at the same time, but other material removal techniques may also be used.

Figure 6:
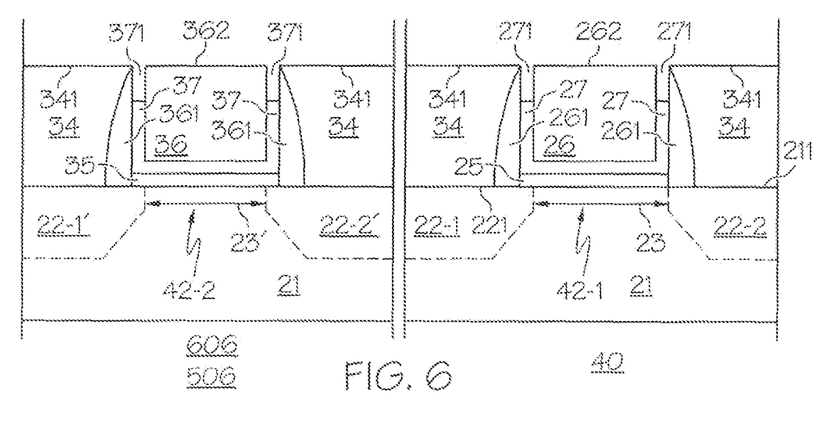

Referring now to manufacturing stage 506 of FIG. 6, structure 605 is exposed to an etchant or etching process to selectively remove portions 271, 371 of barrier layers 27, 37 proximate upper surfaces 341, 262, 362. The particular choice of etchant or etching process will depend upon the particular material chosen for barrier layer 27, 37 and is within the competence of those of skill in the art. Where barrier layer 27, 37 is of, for example, titanium nitride, then dry plasma etch etching using $Cl_2$ as an etchant is a non-limiting example of a suitable process and etchant, but other etching methods and etchants can also be used. Structure 606 results in which upper portions 271, 371 of barrier layers 27, 37 exposed near upper surface 341, 262, 362 of FETs 42 of IC 40 have been removed.

Figure 7:
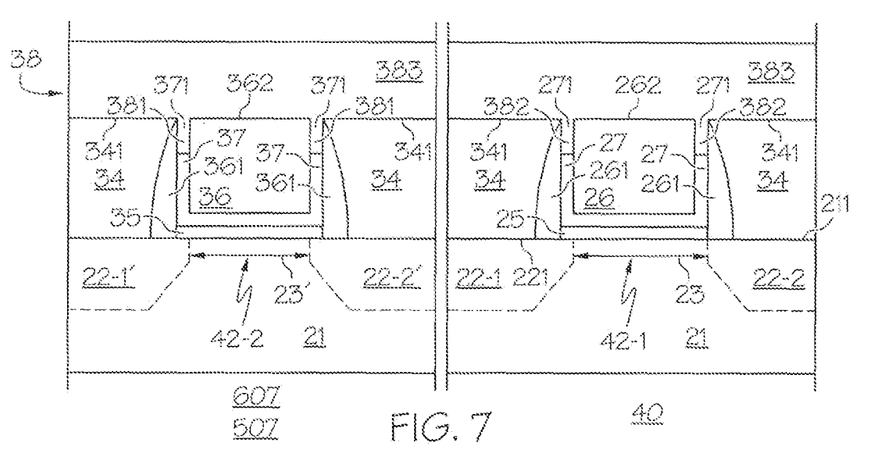

Referring now to manufacturing stage 507 of FIG. 7, layer 38 is applied over upper surfaces 341, 262, 362 so that portions 382, 381 of layer 38 fill voids 271, 371, respectively, in the upper portions of barrier layers 27, 37, and portion 383 of layer 38 overlies the remainder of surfaces 341, 262, 362. Silicon oxide, silicon nitride, and silicon carbide are non-limiting examples of useful materials for layer 38, but other materials may also be used. Silicon oxide is preferred. In other embodiments, a metal such as aluminum may also be used for layer 38, in which case it is desirable that the material of layer 38 be chemically compatible with the material of gate conductors 26, 36, that is, so that both portions 381, 382 and conductors 26, 36 may be partially converted to or replaced by dielectric during substantially the same manufacturing stage, as is subsequently explained in connection with FIG. 9. Structure 607 results.

Figure 8:
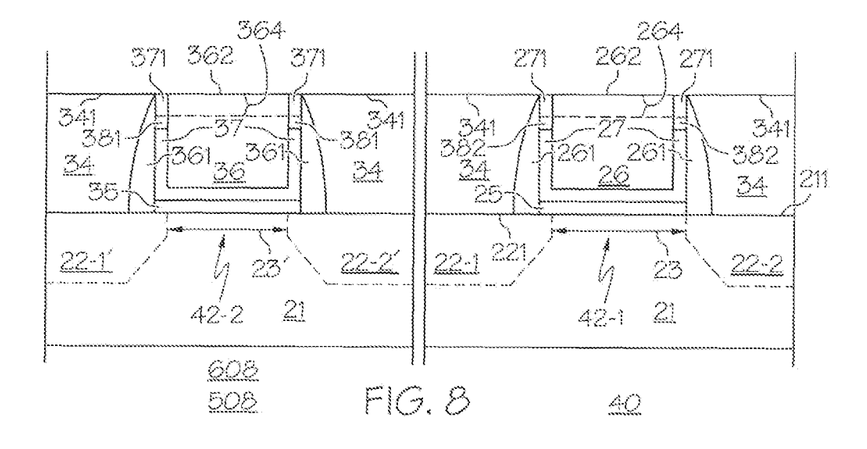

In manufacturing stage 508 of FIG. 8, portion 383 of layer 38 overlying surfaces 341, 262, 362 is removed, leaving behind portion 382 filling void 271 of barrier layer 27 and portion 381 filling void 371 of barrier layer 37. Chemical-mechanical polishing (CMP) is a non-limiting example of a suitable means for removing portions 383 of layer 38 of structure 607. Structure 608 results. Where one or both of barrier layers 27, 37 is an electrical insulator, manufacturing stages 506-508 may be omitted for such layer. Reference numbers 264, 364 indicate those upper parts of gate conductors 26, 36 (and portions 382, 381 if not already of dielectric) that will be converted to or replaced by dielectric regions 29, 39 in manufacturing stage 519 of FIG. 9.

Figure 9:
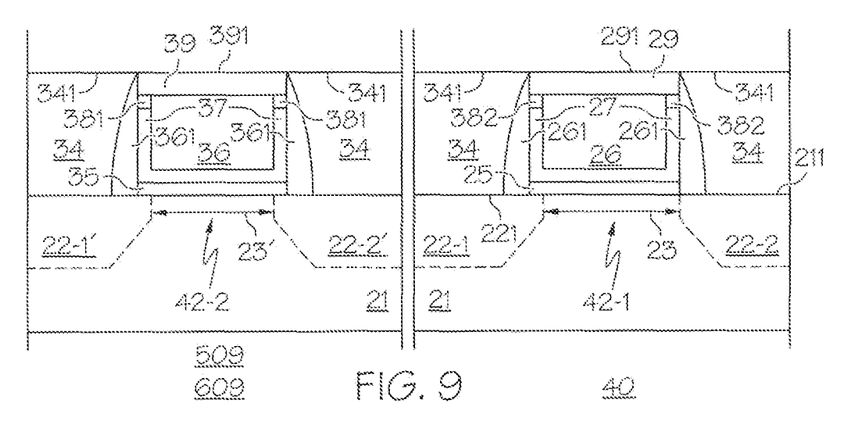

Referring now to manufacturing stage 509 of FIG. 9, upper parts of portions 382, 381 (if not already dielectric) in voids 271, 371 of FIG. 8 and upper parts of gate conductors 26, 36 (collectively upper parts 264, 364 shown in FIG. 8) are converted to dielectric region 29 having upper surface 291 and dielectric region 39 having upper surface 391, respectively. Where portions 382, 381 and gate conductors 26, 36 are formed from aluminum or aluminum containing materials, conversion to dielectric may be conveniently accomplished by plasma anodization or fluoridation using, for example, oxygen or fluorine gas, or by wet anodization or fluoridation. Either method converts such materials to insulating aluminum oxide or aluminum fluoride dielectrics. Alternative materials such as tungsten or titanium nitride if used for conductors 26, 36 (and/or portions 382, 381) may also be converted to dielectric regions 29, 39 by substantially equivalent techniques well known in the art. Structure 609 results in which dielectric regions 29, 39 have replaced upper portions 264, 364 of gates 26, 36 of FIG. 8 (including portions 382, 381 if not already dielectric).

Figure 10:
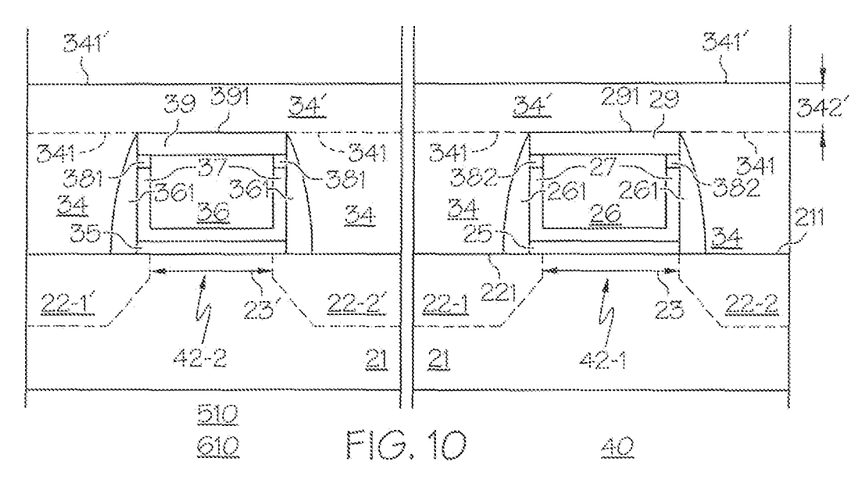

Referring now to manufacturing stage 510 of FIG. 10, dielectric layer 34' having upper surface 341' and of thickness 342' is provided over surface 341, 291, 391. Thickness 342' is usefully in the range of about 3 to 20 nanometers, but thicker and thinner layers may also be used. Layer 34' is preferably but not essentially of substantially the same material as used for layer or region 34, but other dielectric materials may also be used. Structure 610 results. Structure 610 somewhat resembles that shown in FIG. 1, but with the important difference that upper portions of barrier layers 27, 37 and gates 26, 36 have been replaced by dielectric regions 29, 39 respectively.

Figure 11:
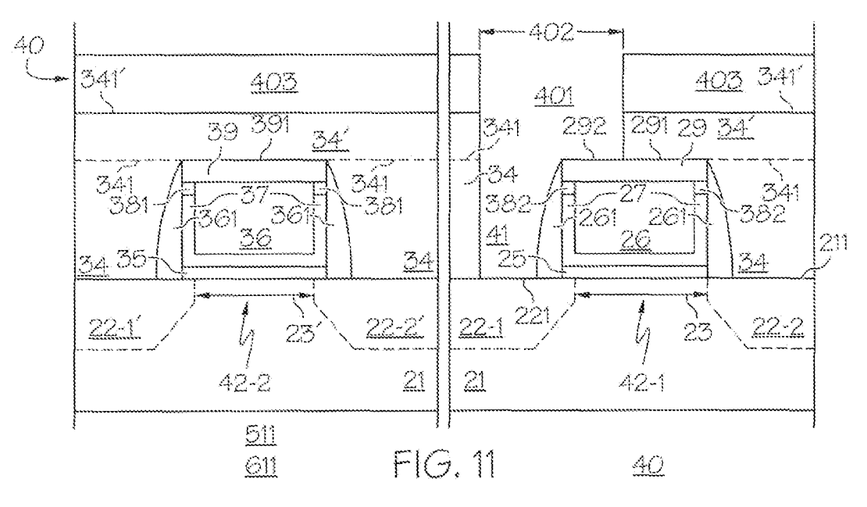

Referring now to manufacturing stage 511 of FIG. 11, mask 40 is provided over surface 341', having opening 401 of lateral width 402 and closed portions 403. For convenience of explanation, width 402 is assumed to be the same as width 302' of FIG. 3 and opening 401 is assumed to be mis-aligned with respect to underlying SC region 22-1 and gate 26 of FIG. 11 as corresponding opening 301' was mis-aligned with respect to underlying SC region 22-1 and gate 26 of FIG. 3, but other widths and placement may also be used. Opening 401 of mask 40 is used to etch or otherwise excavate underlying dielectric layer 34', 34 to form opening or passage 41 extending to surface 221 of underlying SC region 22-1 of substrate 21. Because of the overlap of mask opening 401 above gate 26, passage 41 laps over gate 26 of FET 42-1. Structure 611 results.

Figure 12:
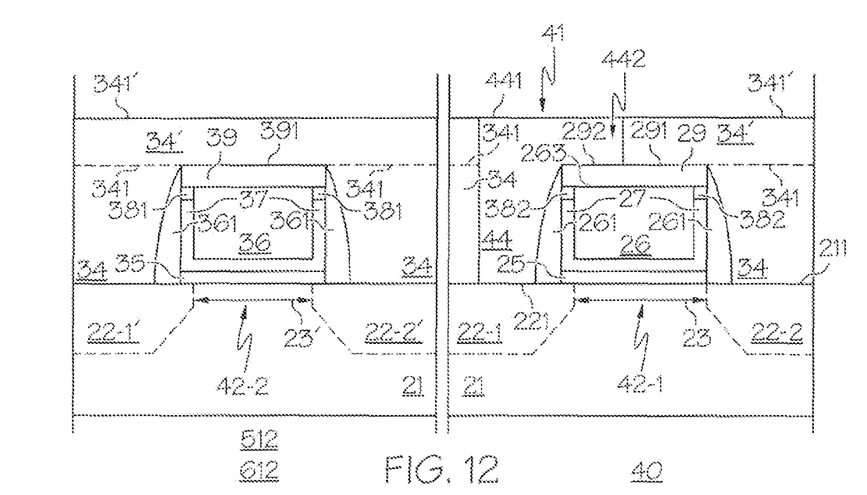

Referring now to manufacturing stage 512 of FIG. 12, passage 41 is filled by conductor 44 having substantially planarized upper surface 441. (An analogous contact forming procedure is described in more detail in connection with contacts 71-1, 71-2 illustrated in FIGS. 18 and 19 and is incorporated herein by reference). Conductor 44 makes electrical contact to surface 221 of underlying SC region 22-1 of substrate 21, as is desired. Even though portion 442 of conductor 44 overlaps gate 26, no contact-to-gate short is formed. Overlap portion 442 of conductor 44 lies on portion 292 of dielectric region 29 rather than on underlying gate 26 and/or barrier layer 27. Dielectric region 29 is present between upper surface 263 of gate 26 and overlap portion 442 of contact 44. Thus, the contact-to-gate short illustrated in FIG. 4 is avoided, even though the same mis-alignment (including mis-sizing or mis-placement) is present in contact 44 of FIG. 12 as was present in contact 32 of FIG. 4. As noted in connection with FIGS. 1-4, such mis-alignment may arise from lithographic limitations or other types of manufacturing deficiencies. The cause of such mis-alignment does not matter. What is important is that the contact structure and method illustrated in the various embodiments described herein is tolerant of such errors. Structure 612 results in which contact 44 is provided to underlying portion 221 of SC region 22-1, without also creating a short to nearby gate 26, even though contact 44 is so closely spaced that it partially overlaps gate 26. Thus, the problem illustrates in FIG. 4 is avoided. This is a significant advance in the art and can materially reduce manufacturing defects resulting from inherent lithographic mis-alignment, mis-sizing or other masking errors. Thus, contact 44 and the method used to provide it are much more tolerant of such inherent manufacturing limitations than prior art contacts and methods.

Figure 13:
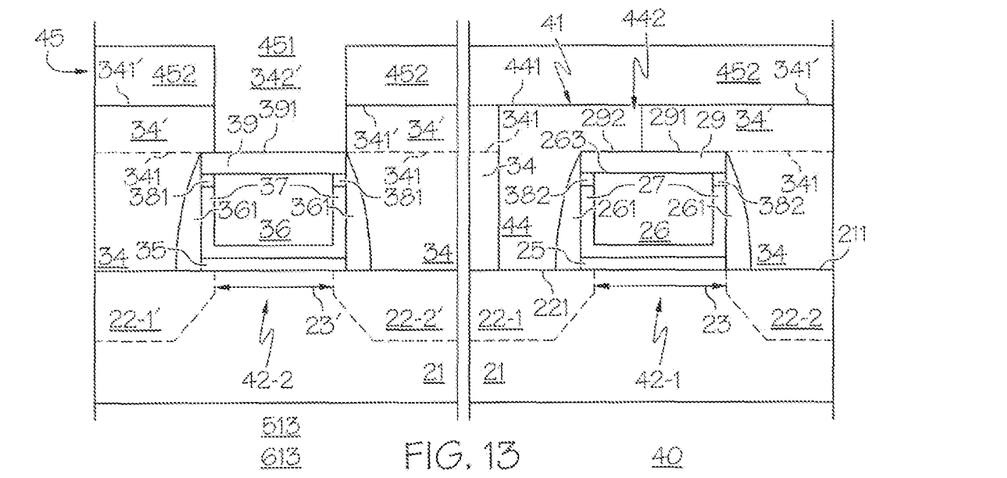

Referring now to manufacturing stage 513 of FIG. 13, mask 45 having opening 451 and closed portion 452 is provided on upper surface 341', 441 of structure 612. In this example, opening 451 is placed so as to provide contact to gate 36 of FET 42-2 of IC 40. FET 42-2 may be in the immediate vicinity of FET 42-1 or located elsewhere in IC 40 or may be another part of FET 42-1, for example, lying in front of or behind the cross-sectional plane of FET 42-1 illustrated in FIG. 13. Manufacturing stage 513 applies in either situation. Using opening 451, passage 342' is etched or otherwise formed through dielectric layer 34' to expose upper surface 391 of dielectric region 39 over gate 36. Structure 613 results.

Figure 14:
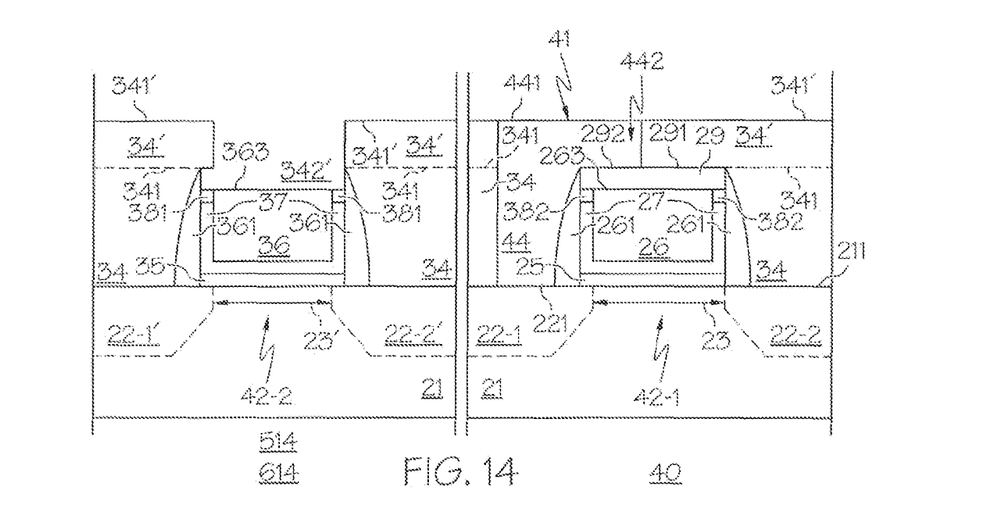

Referring now to manufacturing stage 514 of FIG. 14, mask 45 may be left in place or removed (as illustrated) depending upon the relative etch rates and thicknesses of dielectric regions 34' and 39. Either arrangement is useful and within the competence of those of skill in the art. Dielectric region 39 lying beneath open passage 342' of structure 613 is removed. Plasma etching is a non-limiting example of a suitable etching process. Persons of skill in the art will understand how to choose an appropriate etchant gas based on the material of dielectric region 39. Other removal techniques well known in the art may also be used. Upper surface 363 of gate conductor 36 is thereby exposed. Structure 614 results.

Figure 15:
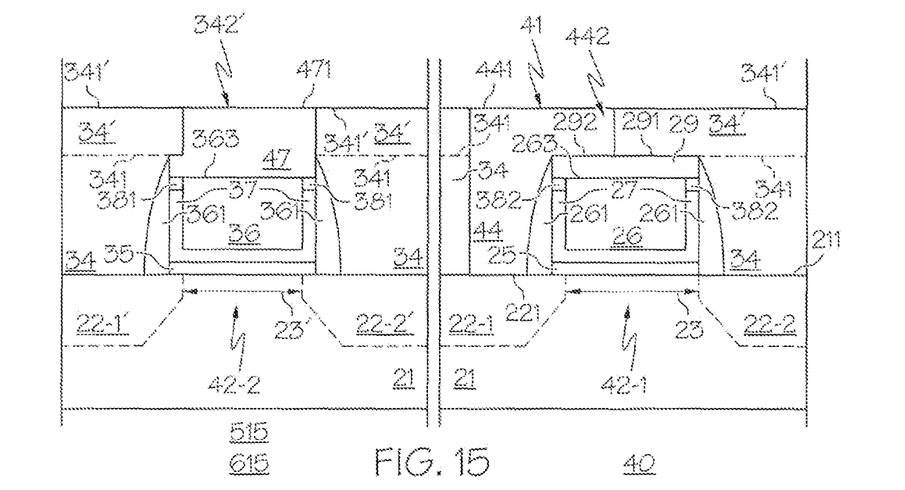
Figure 16:
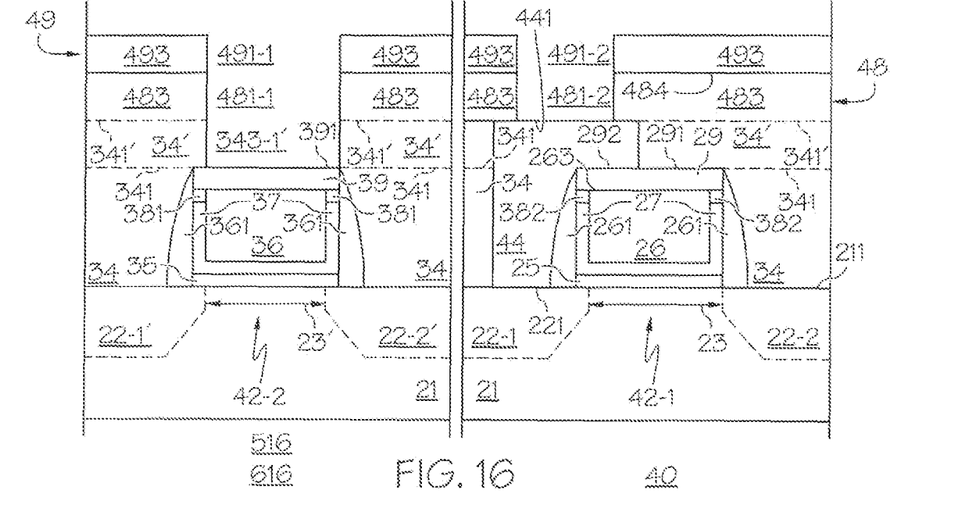
FIGS. 16-19 show simplified cross-sectional views at various manufacturing stages analogous to those of FIGS. 5-15 of a portion of an IC embodying several FETs, according to further embodiments of the invention.

Referring now to manufacturing stage 515 of FIG. 15, passage 342' extending to surface 363 of gate 36 is filled with conductor 47 and planarized using means well known in the art (e.g., see contact 71-1 of FIGS. 18-19 for an illustration of such process), thereby making electrical contact with gate 36 of FET 42-2, as is desired. Conductor 47 has upper surface 471, desirably but not essentially substantially coplanar with upper surface 441 of contract 44 and upper surface 341' of dielectric region 34', 34. Structure 615 results. This illustrates the capability of this embodiment of the invention to make mis-alignment tolerant contact to, for example, S-D region 22-1 of FET 42-1 without creating a contact-to-gate short to nearby gate 26, and also to be able to make electrical contact with gate 36 of FET 42-2 (which may be the same or different than gate 26 of FET 42-1) in IC 40 as a part of the same overall manufacturing process. This is a significant advance in the art. Structure 615 may be subject to such other "back-end" manufacturing stages as may be desired to provide further contacts, dielectric layers, interconnections and protective packaging for IC 40, according to the needs of the user. Such back-end manufacturing stages are well known in the art.

Further embodiments of the invention are illustrated in FIGS. 16-19, which follow from structure 612 of FIG. 12. Referring now to manufacturing stage 516 of FIG. 16, dielectric layer 48 having upper surface 484 is desirably but not essentially applied over surface 341', 441 of structure 612 of FIG. 12. However, layer 48 may be omitted. When used, layer 48 is conveniently of the same type of material used for dielectric layers or regions 34, 34', but other dielectric materials may also be used. Mask 49 having open regions 491-1 and 491-2 and closed portions 493 is applied over upper surface 484 of dielectric layer 48 or over upper surface 341', 441 if layer 48 is not used. When layer 48 is present, openings 491-1, 491-2 are used to remove underlying portions 481-1 and 481-2 of layer 48, thereby exposing upper surface 441 of contact 44 of FET 42-1 and the part of upper surface 341' underlying mask opening 491-1 above FET 42-2. Portion 343-1' of layer 34' underlying opening 491-1 is also removed, thereby exposing upper surface 391 of dielectric region 39 on gate 36. Structure 616 results.

Figure 17:
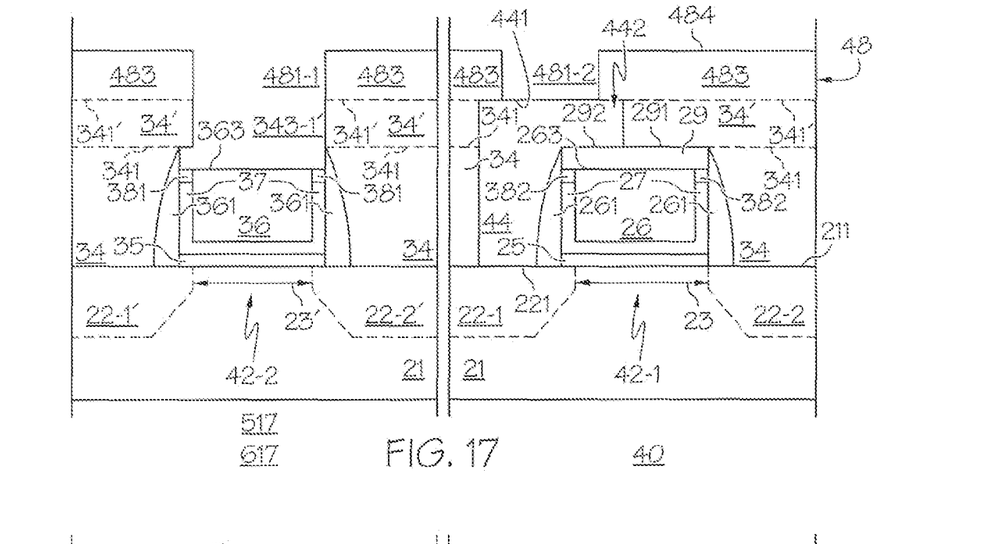

Referring now to manufacturing stage 517 of FIG. 17, mask 49 may be left in place or removed (as illustrated) depending upon the relative etch rates and thicknesses of dielectric regions 34' and 39. Either arrangement is useful and within the competence of those of skill in the art. Dielectric region 39 of FET 42-2 underlying openings 491-1, 481-1 and 343-1' is then removed in substantially the same way as described for dielectric region 39 of FET 42-2 in connection with FIG. 14. Structure 617 results, wherein upper surface 363 of gate conductor 36 and upper surface 441 of contact 44 are exposed while upper surface 263 of gate 26 remains protected by dielectric region 29.

Figure 18:
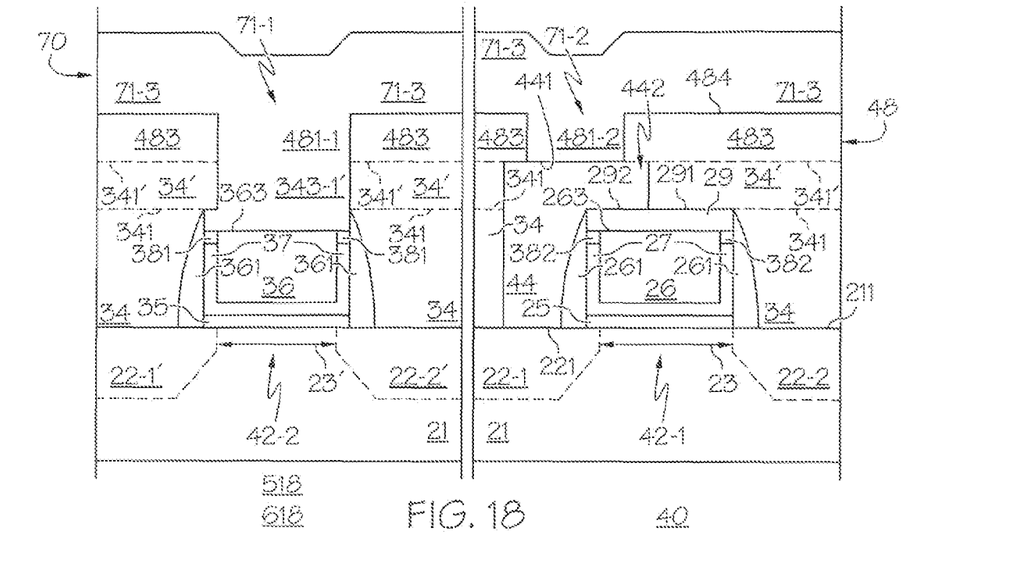

Referring now to manufacturing stage 518, conductor layer 70 is applied over surface 484 of structure 617. Tungsten, copper, titanium nitride and/or combinations thereof are non-limiting examples of suitable materials for conductor layer 70, but other electrically conductive materials may also be used. Tungsten is preferred. Conductor layer 70 has portion 71-1 extending into opening 481-1, 343-1' and making contact with upper surface 363 of gate 36. Conductor layer 70 has portion 71-2 extending into opening 481-2 and making contact with upper surface 441 of contract 44, without shorting to underlying gate 26 even though opening 481-2 may significantly overlap gate 26. Layer 70 has portion 71-3 overlying upper surface 484 of dielectric layer 48 laterally outside of openings 481-1 and 481-2. Structure 618 results.

Figure 19:
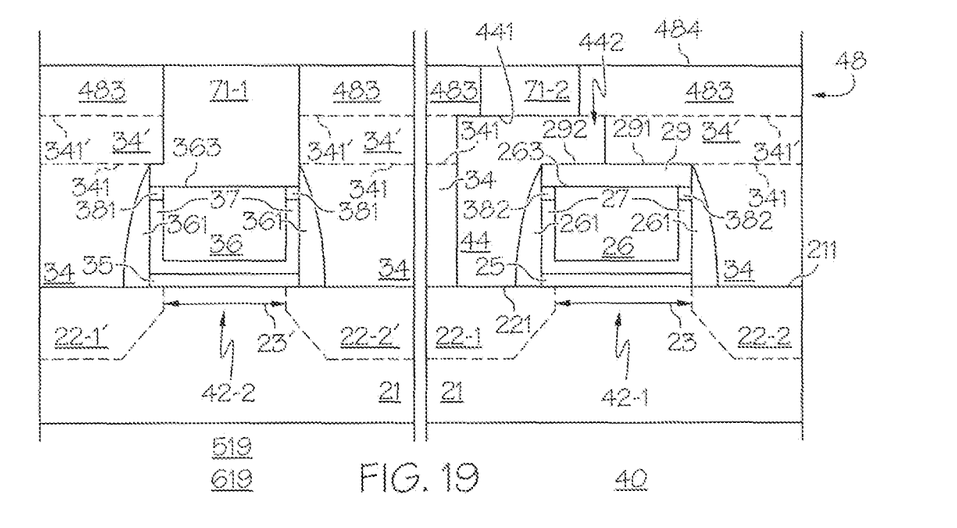

Referring now to manufacturing stage 519 of FIG. 19, portion 71-3 of layer 70 is desirably removed, for example, by chemical mechanical polishing (CMP) using techniques well known in the art. Structure 619 results, wherein contact 71-1 to gate 36 of FET 42-2 and contact 71-2, 44 to underlying device region 22-1 of FET 42-1 are exposed on upper surface 484 of dielectric layers 48, 34', 34, without contact 71-2, 44 shorting to gate 26 of FET 42-1, even though contact 44 is very closely spaced to gate 26 and mask opening 401 used to form gate 44 is substantially mis-aligned (including mis-positioned or mis-sized) with respect to gate 26. Thus, the mis-alignment tolerant aspects of the contact structure and method used for closely spaced contacts (e.g., contact 44 to SC region 22-1 of FET 42-1) are preserved without interfering with the formation of other contacts (e.g., contact 47, 71-1 to FET 42-2) elsewhere in IC 40. This improved mis-alignment tolerance is capable of significantly improving manufacturing yield and reducing product cost, especially as ICs of increased density and complexity are sought. This is a significant advance in the art. Structure 619 may be subject to such other "back-end" manufacturing stages as may be desired to provide further contacts, dielectric layers, interconnections and protective packaging for IC 40, according to the needs of the user. Such back-end manufacturing stages are well known in the art.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for forming an integrated circuit (40) with a mis-alignment tolerant electrical contact (44), comprising:
providing a substrate (21) with a first upper surface (211), a semiconductor region (22-1) with a contact area (221) on the first upper surface (211), a first electrically conductive region (26) laterally proximate the semiconductor region (22-1) over the first upper surface (211), and a first dielectric region (34, 34') over the first upper surface (211) substantially laterally enclosing the first electrical conductor (26);
converting an upper portion (264) of the first electrical conductor (26) to a second dielectric region (29);
applying a mask (40) over the first (34, 34') and second (29) dielectric regions, the mask (40) having an opening (401) extending partly over the contact area (221) and partly over the second dielectric region (29);
forming under the mask opening (401) a passage (41) extending through the first dielectric region (34, 34') to the contact area (221) and to a part (292) of the second dielectric region (29);
filling the passage (41) with a conductor (44) thereby making electrical connection to the contact area (221), but wherein the conductor (44) is electrically insulated from the first electrical conductor (26) by the second dielectric region (29);

forming dielectric sidewall spacers (261) on the first conductive region (26) located between the dielectric region (34) and the first electrical conductor (26); and forming a barrier layer (27) laterally surrounding the first electrical conductor (26) between the first electrical conductor (26) and the dielectric sidewall spacers (261);

wherein the barrier layer is an electrical conductor, the method further comprising prior to the step of applying the mask (40), replacing an upper part (271) of the barrier layer (27) with another material (382), and wherein replacing an upper part (271) of the barrier layer (27) with another material (382) occurs prior to converting an upper portion (264) of the first electrical conductor (26), and when the another material (382) is an electrical conductor, the method further comprises, converting at least some of the another material (382) to a third dielectric at substantially the same time as converting the upper portion (264) of the first electrical conductor (26) to the second dielectric, thereby forming the dielectric region (29) from a combination of the second and third dielectrics.

2. The method of claim 1, wherein applying the mask (40) includes providing the opening (401) extending across a part of the dielectric sidewall spacers (261).

3. The method of claim 1, wherein forming the dielectric region (29) comprises forming an aluminum containing dielectric region (29).

4. The method of claim 1, wherein replacing with the another material (382) comprises replacing with another dielectric material and forming the dielectric region (29) from a combination of the second dielectric and such another dielectric material.

5. The method of claim 1, wherein forming the barrier layer (27) comprises forming the barrier layer (27) of a dielectric material.

6. The method of claim 1, wherein providing the substrate (21) further comprises providing a second electrical conductor (36) over the first upper surface (211) also substantially laterally enclosed by the first dielectric region (34, 34').

7. The method of claim 6, further comprising converting an upper portion (364) of the second electrical conductor (36) to a further dielectric region (39).

8. The method of claim 7, further comprising, removing the further dielectric region (39) and providing a conductor (47) making electrical connection to the second electrical conductor (36).

9. The method of claim 8, wherein removing the further dielectric region (39) occurs after making electrical connection to the contact area (221).

10. A method for forming an integrated circuit (IC) having a field effect transistor (FET), comprising:

providing a semiconductor containing substrate (21) over which is a FET gate (26) laterally bounded by a first dielectric region (34);

replacing an upper portion (264) of the FET gate (26) with a second dielectric region (29);

applying a mask (40) having an opening (401) extending partly over a source or drain (22) contact region (221) of the substrate (21) and over a part (292) of the second dielectric region (29) above the FET gate (26);

forming an opening (41) through the first dielectric region (34) extending to the contact region (221) and the part (292) of the second dielectric region (29); and filling the opening (41) with a conductor (44) making electrical contact with the contact region (221) but electrically insulated from the FET gate (26) by the second dielectric region (29), wherein the FET gate (26) is laterally enclosed by a barrier layer (27) between the FET gate (26) and the first dielectric region (34), and further comprising prior to applying the mask (40), at least partly replacing an upper portion (271) of the barrier layer with a further dielectric that joins with the second dielectric region (29), and wherein replacing an upper portion (271) of the barrier layer with a further dielectric, comprises:

replacing the upper portion (271) of the barrier layer (27) with a conductor material (382); and converting the conductor material (382) to the further dielectric during substantially the same manufacturing stage as when the upper portion (264) of the FET gate (26) is replaced with the second dielectric region (29).

11. The method of claim 10, wherein providing a semiconductor containing substrate (21), further comprises providing a semiconductor containing substrate (21) over which are a first FET gate (26) and a second FET gate (36), laterally bounded by the first dielectric region (34).

* * * * *